(12) United States Patent
Robinson et al.

(10) Patent No.: US 6,326,303 B1
(45) Date of Patent: *Dec. 4, 2001

(54) COPPER ELECTROLESS DEPOSITION ON A TITANIUM-CONTAINING SURFACE

(75) Inventors: Karl Robinson, Boise, ID (US); Ted Taylor, Helena, MT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/503,593

(22) Filed: Feb. 11, 2000

Related U.S. Application Data

(63) Continuation of application No. 09/140,701, filed on Aug. 26, 1998, now Pat. No. 6,126,989
(60) Provisional application No. 08/916,219, filed on Aug. 22, 1997, now Pat. No. 6,054,173.

(51) Int. Cl.⁷ .................................................. H01L 21/44
(52) U.S. Cl. .......................... 438/678; 438/597; 438/656; 438/688
(58) Field of Search .................................... 438/678, 597, 438/688, 648, 656

(56) References Cited

U.S. PATENT DOCUMENTS

| | | | |
|---|---|---|---|
| 3,672,986 | 6/1972 | Schneble et al. | 117/212 |
| 3,708,329 | 1/1973 | Schonenberg | 117/47 R |
| 3,994,727 | 11/1976 | Polichette et al. | 96/38.4 |
| 4,143,186 | 3/1979 | Davis | 427/345 |
| 4,209,331 | 6/1980 | Kukanskis et al. | 106/1.23 |
| 4,211,564 | 7/1980 | Oka | 106/1.23 |
| 4,228,213 | 10/1980 | Beckenbaugh et al. | 428/209 |
| 4,265,943 | 5/1981 | Goldstein et al. | 427/305 |
| 4,273,804 | 6/1981 | Feldstein | 427/97 |
| 4,340,620 | 7/1982 | Mielsch et al. | 427/292 |
| 4,378,384 | 3/1983 | Murakami et al. | 427/97 |
| 4,511,597 | 4/1985 | Teng et al. | 427/53.1 |
| 4,693,907 | 9/1987 | Ishikawa | 427/97 |
| 4,699,811 | 10/1987 | Kunces | 427/259 |
| 4,720,404 | 1/1988 | Culjkovic | 427/98 |
| 4,962,058 | 10/1990 | Cronin et al. | 437/187 |
| 5,151,168 | 9/1992 | Gilton et al. | 205/123 |
| 5,169,680 | 12/1992 | Ting et al. | 427/96 |
| 5,387,315 | 2/1995 | Sandhu | 156/646 |
| 6,054,172 | 4/2000 | Robinson et al. | 427/97 |
| 6,054,173 | 4/2000 | Robinson et al. | 427/98 |
| 6,126,989 | * 10/2000 | Robinson et al. | |

FOREIGN PATENT DOCUMENTS

| | | |
|---|---|---|
| 2 034 261 | 7/1970 | (DE) . |
| 61-087893 | 5/1986 | (JP) . |
| WO 99/10916 | 3/1999 | (WO) . |

OTHER PUBLICATIONS

"Encyclopedia Of Chemical Technology", Third Edition, 8, 745–746 (1979).
Arita, Y., et al., "Copper Metallization Technology for Deep Submicron ULSIs", *MRS Bulletin*, 68–74 (1994).
Caturla, F., et al., "Electroless Plating of Graphite with Copper and Nickel", *J. Electrochem. Soc*, 142, 4084–4090 (1995).

(List continued on next page.)

Primary Examiner—Kevin M. Picardat
Assistant Examiner—D. M. Collins
(74) *Attorney, Agent, or Firm*—Mueting, Raasch & Gebhardt, P.A.

(57) ABSTRACT

A method for depositing copper on a titanium-containing surface of a substrate is provided. The method includes forming a patterned catalyst material on the substrate, such that the titanium-containing surface is exposed in selected regions. The catalyst material has an oxidation half-reaction potential having a magnitude that is greater than a magnitude of a reduction half-reaction potential of titanium dioxide. Copper is then deposited from an electroless solution onto the exposed regions of the titanium-containing surface.

8 Claims, 4 Drawing Sheets

OTHER PUBLICATIONS

Charbonnier, M., et al., "Plasma Treatment Process for Palladium Chemisorption onto Polymers before Electroless Deposition", *J. Electrochem. Soc.*, 143, 472–480 (1996).

Cho, J., et al., "Electroless Cu for VLSI", *MRS Bulletin*, 18, 31–38 (1993).

Cornell, J., "Experiments with Mixtures: A Review", *Technometrics*, 15, 437–455 (1973).

DeSilva, M., et al., "A Novel Seed Layer Scheme to Protect Catalytic Surfaces for Electroless Deposition", *J. Electrochem. Soc.*, 143, 3512–3516 (1996).

DeSilva, M., et al., "High Aspect Ratio Microtunnel Technique to Empirically Model Electroless Deposition", *J. Electrochem. Soc.*, 143, L78–L80 (1996).

Honma, H., et al., "Electroless Copper Deposition Process Using Glyoxylic Acid as a Reducing Agent", *J. Electrochem. Soc.*, 141, 730–733 (1994).

Kondo, K., et al., "Acceleration of Electroless Copper Deposition in the Presence of Excess Triethanolamine", *J. Electrochem. Soc.*, 138, 3629–3633 (1991).

Kondo, K. et al., "Effects of 2,2'-Dipyridl on Electroless Copper Deposition in the Presence of Excess Triethanolamine", *J. Electrochem. Soc.*, 140, 1598–1601 (1993).

Mak, C., "Electroless Copper Deposition on Metals and Metal Silicides", *MRS Bulletin*, 19, 55–62 (1994).

Mak, C., et al., "Selective electroless copper metallization of palladium silicide on silicon substrates", *Appl. Phys. Lett.*, 59, 3449–3451 (1991).

Matsuoka, M., et al., "Kinetics of Electroless Copper Plating and Mechanical Properties of Deposits", *J. Electrochem. Soc.*, 139, 2466–2470 (1992).

Mishra, K., et al., "Kinetics and Mechanism of Electroless Deposition of Copper", *J. Electrochem. Soc.*, 143, 510–516 (1996).

Palmans, R., et al., "Development of an Electroless Copper Deposition Bath for Via Fill Applications on Tin Seed Layers", Advanced Metallization for ULSI Applications in 1994 Conference, *Materials Research Society*, 87–94, Austin, TX, Oct. 4–6, 1994.

Palmans, R., et al., "Feasibility study of electroless copper deposition for VLSI", *Applied Surface Science*, 53, 345–352 (1991).

Shacham–Diamand, Y., "100 nm wide copper lines made by selective electroless deposition", *Journal of Micromechanics and Microengineering*, 1, 66–72 (1991).

Shacham–Diamand, Y., "Electrochemically Deposited Copper for ULSI Technology", Proceedings of the Second Symposium on Electrochemically Deposited Thin Films, The Electrochemical Society Proceedings vol. 94–31, 293–301 (undated).

Shacham–Diamand, Y., et al., "Electroless copper desposition for ULSI", *Thin Solid Films*, 262, 93–103 (1995).

Shacham–Diamand, Y., "Narrow (0.1$\mu$m—0.5$\mu$m) Copper Lines for Ultra–Large Scale Integration (ULSI) Technology", $7^{th}$ Meeting in Israel on Optical Engineering, *SPIE*, 1442, 11–19 (1990).

Shacham–Diamand, Y., et al., "The Characterization of Electroless Copper Deposition from an Alkali Free Solution", Proceedings of the Second Symposium on Electrochemically Deposited Thin Films, The Electrochemical Society Proceedings vol. 94–31, 136–145 (Oct. 1994).

Sokal, R., et al., "Biometry", W.H. Freeman & Company, San Francisco, CA, Title Page, Table of Contents (1981).

Wong, S., et al., "Electroless Copper Deposition for Multilevel Metallization", *Electronic Packaging Materials Society V*, Materials Research Society Symposium Proceedings, Boston, MA, 347–356 (Nov. 26–29, 1990).

Yoshiki, H., et al., "Pattern Formation of Cu Layer by Photocatalytic Reaction of ZnO Thin Film", *J. Electrochem. Soc.*, 142, L235–l237 (1995).

\* cited by examiner

US 6,326,303 B1

COPPER ELECTROLESS DEPOSITION ON A TITANIUM-CONTAINING SURFACE

This is a continuation of U.S. application Ser. No. 09/140,701, filed Aug. 26, 1998, issued as U.S. Pat. No. 6,126,989, which is a divisional of U.S. application Ser. No. 08/916,219, filed Aug. 22, 1997, issued as U.S. Pat. No. 6,054,173.

FIELD OF THE INVENTION

The present invention relates to methods for forming a layer of copper using electroless deposition, and, in particular, for forming a layer of copper on a titanium-containing surface using electroless deposition and an adjacent catalyst layer.

BACKGROUND OF THE INVENTION

In the fabrication of a semiconductor integrated circuit (IC), it is desirable to fabricate the IC with materials having a low resistivity (i.e., property of resistance to current flow) in order to optimize its electrical performance by decreasing the resistance of the IC. Lower resistance ICs allow faster processing of information due to a smaller delay time associated with resistance to current flow therethrough.

Individual devices are typically connected within an IC using metal lines (i.e., conductive layers), such as aluminum or copper layers. Resistivity of metal lines plays an increasingly important role in the overall resistance of an IC. As ICs become more dense, wiring length increases. Furthermore, wiring pitch decreases, which effectively decreases the wiring width. As the wiring width decreases, resistivity of the wiring material becomes a dominant factor as compared to parasitic capacitance between wires (i.e., that associated with device resistance). Thus, it is desirable to decrease the resistivity of wiring material within an IC.

It is preferable to use copper within an IC, particularly for interconnect lines and structures (i.e., conductive digit lines and plugs connecting the conductive layers), because copper has a lower resistivity and a higher resistance to electromigration (i.e., the transport of metal atoms in conductors carrying large current densities, resulting in morphological degradation of the conductors) than aluminum. Voids (i.e., regions of macroscopic depletion of atoms) and hillocks (i.e., regions of macroscopic accumulation of atoms) are produced by electromigration. One reason why copper is less susceptible to voiding than aluminum is because the grain boundary diffusion of vacancies in copper has a significantly higher activation energy than the same in aluminum.

Techniques for deposition of copper during fabrication of a semiconductor IC have not been selectively controlled in the past. Such conventional copper deposition techniques include evaporation, sputtering, and chemical vapor deposition (CVD). When using nonselective deposition techniques, excess copper often needs to be removed from surfaces to which it adheres, but on which copper is not desired. This requires an extra processing step. An etchant, such as a dry, chlorine-based plasma etchant is typically used for removing excess copper on a surface.

Deposition of copper on certain materials, such as titanium-containing materials (e.g., titanium and titanium nitride), has also been problematic in the past. Titanium-containing materials are utilized in the fabrication of interconnect structures in which copper is typically formed. For example, titanium-containing diffusion barrier layers are beneficial when formed between copper and silicon because copper has a tendency to diffuse into silicon. The use of diffusion barrier layers prevents the degree of copper migration seen in the absence of a diffusion barrier layer. By using a titanium-containing diffusion barrier layer, the degree of lattice mismatch between copper and silicon is also minimized, as the lattice spacing of titanium is intermediate between that of copper and that of silicon. Previous deposition of copper on titanium-containing materials, however, has repeatedly been plagued with nonuniform thicknesses, poor adhesion, and poor step coverage on complex surfaces, such as contact holes and vias.

One deposition technique involves the chemical reduction of a metal ion from a metal compound contained in solution onto a catalytically active surface. This is known as electroless deposition. Consequently, this technique has the potential to selectively deposit on catalytically active surfaces. Conventional electroless copper deposition on titanium-containing materials, however, has not been perfected. For example, electrodeposition baths (i.e., ionic solutions without any external electrodes) containing copper sulfate ($CuSO_4$) and sulfuric acid ($H_2SO_4$) often experience difficulties with rapid oxidation (i.e., the formation of native oxides) of the titanium-containing material surface during deposition, which prevents adequate copper layer adhesion. Similarly, baths containing copper pyrophosphate ($Cu_2P_2O_7$), potassium pyrophosphate ($K_2H_2P_2O_7$), ammonium hydroxide ($NH_4OH$), and ammonium nitrate ($NH_4NO_3$), or baths containing copper fluoroborate ($Cu[BF_4]_2$), fluoroboric acid ($HBF_4$), and boric acid ($HBO_3$) do not provide adequate copper layer adhesion due to the fact that deposited copper dissolves away in water. Another electrodeposition bath containing tetra- ammonium cuprate ($Cu[NH_3]_4$) and ammonium hydroxide ($NH_4OH$) does not deposit copper well on titanium-containing diffusion barrier layer materials either.

Conventional electroless copper deposition baths often contain alkali elements, such as lithium, sodium, and potassium, to increase the pH and thereby increase the reaction rate of the electroless deposition process. Alkali components provide a relatively large increase in the pH of an electroless copper deposition bath for a given amount of the alkali components. However, it is undesirable to utilize large amounts of alkali elements in the fabrication of ICs because residual alkali metal ions easily drift under applied electric fields to interfaces, such as silicon/silicon dioxide interfaces within an IC, introducing positive ionic charge in undesired areas that alters device characteristics. This phenomenon potentially causes IC failure, due to such altering of device characteristics.

Another technique for depositing copper on a substrate from an electroless deposition solution includes using a nucleating layer between the substrate and the deposited copper layer in order to initiate copper deposition. In the past, aluminum has been utilized for such a nucleating layer. While the use of such a layer catalyzes the reaction, it does not increase the reaction rate of copper deposition enough to allow for an alkali-free electroless deposition solution to be used in conjunction therewith. Furthermore, when using such a technique, an aluminum layer remains between the copper layer and the substrate. This can potentially cause adhesion problems and increase the resistivity of interconnects when used therein due to the higher resistivity of aluminum as compared to copper. Resistivity of interconnects formed in such a manner is also typically further increased when using such a technique because an oxide layer usually remains on the aluminum layer prior to depositing the copper layer thereon.

Another problem with conventional electroless copper deposition is that implanted nucleation sites need to be formed on the surface on which copper is to be deposited when a nucleation layer is not formed on the underlying surface. Conventionally, electroless deposition of copper onto certain materials, such as titanium-containing materials, will not occur in the absence of implants (e.g., gold, silver, palladium, or platinum) in the underlying surface or activation baths containing similar components. The presence of implants in the underlying surface or the activation bath is needed to provide nucleation sites for the copper deposition reaction. Once copper nucleation is initialized, however, deposited copper acts as its own catalyst via an autocatalytic mechanism (i.e., copper provides more of the catalyzing mechanism—itself—as it is created).

Electroless deposition of copper has been used in printed circuit board (PCB) manufacturing and other applications where critical dimensions are ten microns or greater. Typically, deposition of copper within an IC requires that copper be accurately deposited to much smaller critical dimensions. However, many conventional electroless copper deposition techniques have not perfected accurate deposition at such small critical dimensions.

Thus, there is a need for a method for electroless deposition of copper and other materials that is generally fast and efficient. There is a further need for a method for electroless deposition, such as copper electroless deposition, that does not require nucleation layers, implants, or activation baths for providing nucleation sites on surfaces on which the material is to be deposited. It is further desirable to provide a method for electroless deposition that provides a high conductivity layer of deposited material that adheres well to a substrate.

SUMMARY OF THE INVENTION

The present invention provides methods for the electroless deposition of copper on a titanium-containing surface of a substrate. One method for depositing copper on a substrate includes providing the substrate having a titanium-containing surface and forming a patterned catalyst material on the substrate, such that the titanium-containing surface is exposed in selected regions. The catalyst material has a corresponding oxidation half-reaction potential having a magnitude that is greater than a magnitude of the reduction half-reaction potential of titanium dioxide (a native oxide that spontaneously forms on the surface of the titanium-containing surface). Preferably, the catalyst material is selected from the group of silicon, aluminum, and chromium. Copper is then deposited from an electroless solution on the exposed regions of the titanium-containing surface.

According to another aspect of the invention, the step of depositing copper includes plating copper onto the substrate out of a solution containing a copper source and a reducing agent. The solution can further contain at least one ligand, surfactant, oxidizing agent, or combinations thereof. The electroless solution preferably has a pH of about 9 to about 12. Furthermore, by using the method of the invention, the electroless solution can preferably be substantially free of alkali components (i.e., having less than about 5% total alkali components by atomic weight, but preferably substantially no alkali components by weight), as is desirable in semiconductor IC processing. Copper deposition according to the method of the invention occurs as oxidation of the catalyst layer removes native oxides from the exposed regions of the titanium-containing surface.

The substrate is preferably a semiconductor-based substrate having a titanium-containing surface. The substrate can include only a titanium-containing material or it can include a patterned or blanket titanium-containing layer positioned over another material. The titanium-containing surface can be titanium or titanium nitride, for example. In one embodiment, the substrate includes a printed circuit board having a titanium-containing surface. The titanium-containing surface can be of a variety of thicknesses, but, typically, the thickness is about 50 Angstroms to about 1,000 Angstroms.

In another embodiment of the invention, the method includes providing a substrate having a patterned titanium-containing surface and forming a patterned aluminum layer on the substrate, such that the patterned titanium-containing surface is exposed in selected regions. In a preferred embodiment, the patterned aluminum layer has a thickness of at least about 1,000 Angstroms. Copper is then formed on the exposed patterned titanium-containing surface regions adjacent to the patterned aluminum layer using electroless copper deposition. Copper deposition occurs as oxidation of the aluminum layer removes native oxides from the exposed regions of the patterned titanium-containing surface. According to this aspect, the method can further include a step of removing the patterned aluminum layer.

In yet another embodiment of the invention, a method for forming a plug in an integrated circuit (IC) interconnect structure includes providing a substrate as described above, and then forming an insulating layer on the substrate. A via is then defined in the insulating layer over an active area (e.g., a source/drain region of a transistor or an upper plate electrode of a capacitor, to illustrate just a couple of a wide variety of such electronically active areas in an IC) in the substrate. A titanium-containing layer is then formed in the via and over the insulating layer. A patterned catalyst layer is then formed over the titanium-containing layer adjacent to the via. The via is then at least partially filled, although it can be filled or overfilled, with copper using electroless deposition. In this method, copper deposition is believed to initiate at an interface between the titanium-containing layer and the catalyst layer. In a further embodiment, the method includes a step of removing the patterned catalyst layer. In yet another embodiment, the method includes a step of removing the titanium-containing layer. In still another embodiment, the method includes a step of removing excess copper (i.e., the overfilled portion of the copper), as by planarization, for example.

In yet another embodiment of the invention, a dual damascene method for forming an interconnect structure in an IC includes providing a substrate and then forming an insulating layer on the substrate. A via is then defined in the insulating layer over an active area in the substrate. A titanium-containing layer is then formed in the via and over the insulating layer and a patterned catalyst layer is formed over the titanium-containing layer, such that an exposed region of the insulating layer surrounds the via. Another step includes at least partially filling the via, although it can be filled or overfilled, and the exposed region of the insulating layer with copper using electroless deposition. In a further embodiment, the method comprises the step of removing a patterned catalyst layer. In yet another embodiment, the method includes a step of removing the titanium-containing layer. In still another embodiment, the method includes a step of removing the excess copper as described above.

DETAILED DESCRIPTION OF THE INVENTION

Figure 1A:
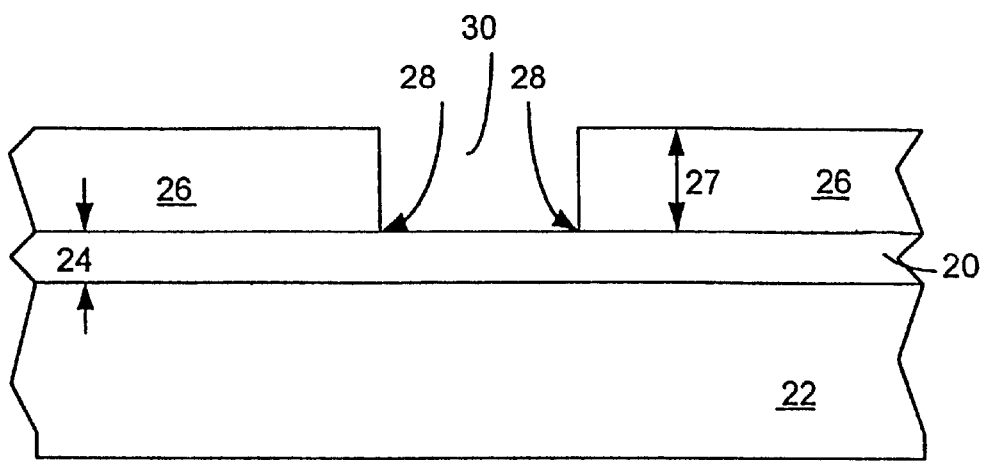
FIGS. 1A, 1B and 1C are cross-sectional representations of copper deposited on a substrate in accordance with the present invention, and intermediate structures thereof.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural and chemical changes may be made without departing from the scope of the present invention. The following detailed description is, therefore, not to be taken in a limiting sense, and the scope of the present invention is defined by the appended claims.

Copper is deposited from an electroless deposition solution onto catalytically active surfaces (i.e., those surfaces that are undergoing reduction in conjunction with the oxidation of a catalyst layer)—namely titanium-containing surfaces. The titanium-containing surface is preferably titanium itself, but can also be, for example, titanium nitride. Also, the titanium-containing surface can be non-patterned (i.e., a blanket titanium-containing layer or substrate) or a patterned layer.

A surface is made catalytically active by forming a catalyst layer adjacent to the titanium-containing layer on which the copper is to be deposited. It is to be understood that adjacent, as used herein, is meant to include physical contact of the catalyst layer with the titanium-containing layer. The catalyst layer need not be positioned directly over the titanium-containing layer. Adjacent is also meant to include physical separation of the catalyst layer and the titanium-containing layer, but which allows for the flow of electrons from the catalyst layer to the titanium-containing layer. The deposition reaction proceeds due to the oxidation of the catalyst layer, providing electrons for the reduction of titanium dioxide (i.e., native oxide that undesirably, spontaneously forms on metallic-containing material) on the titanium-containing layer on which the copper is deposited. The resulting copper layer is formed directly over the underlying titanium-containing layer on which it is desired, without any nucleation layers or implanted sites therebetween. The reduction of the titanium dioxide on the underlying surface provides a low resistance path to electrical current due to the removal of native oxides on the surface of the underlying layer.

It is to be understood that the term substrate, as used herein, includes a wide variety of semiconductor-based structures and other structures on which copper is deposited. Substrates are often used as building blocks within a semiconductor integrated circuit (IC). However, substrate, as used herein, can also refer to a printed circuit board (PCB) or other structures on which copper is deposited. A substrate can be a single layer of material, such as a silicon wafer. Substrate is also to be understood as including silicon-on-sapphire (SOS) technology, silicon-on-insulator (SOI) technology, doped and undoped semiconductors, epitaxial layers of silicon supported by a base semiconductor, as well as other semiconductor-based structures, including any number of layers as is well known to one skilled in the art. Furthermore, when reference is made to a substrate in the following description, previous process steps may have been utilized to form regions/junctions in a base semiconductor structure.

To form a conducting layer, such as a metal line or a metal plug, in an IC interconnect structure, oftentimes other inorganic layers (e.g., insulating layers and conducting layers that connect individual devices within an IC) are first formed as part of a substrate. For example, when forming a contact to an active area of an IC, one or more layers of material (e.g., titanium, titanium silicide, and/or titanium nitride) are commonly formed prior to at least partially filling a contact hole with a metal. Titanium silicide serves to lower the resistivity of the contact, while titanium nitride serves as a diffusion barrier between the active area and the conducting layer.

The process used for depositing such layers (e.g., insulating layers) within an IC is well known to one skilled in the art. There are numerous methods and sequences of steps available for forming titanium silicide and titanium nitride, for example. Oftentimes, titanium is deposited over an active area (i.e., an area which typically contains silicon in a semiconductor IC) and annealed to form titanium silicide. Titanium nitride is often formed by annealing a deposited titanium layer in a nitrogen-containing atmosphere. However, both titanium silicide and titanium nitride can also be sputtered onto a substrate, as well as being formed using other techniques well known to one skilled in the art. The thickness of such layers is typically about 50 Angstroms to about 1,000 Angstroms.

While the invention is described with reference to depositing copper onto a titanium-containing material, copper may deposit on other surfaces adjacent to the titanium-containing material, such as silicon dioxide or borophosphosilicate glass (BPSG), but the copper will not typically adhere to or nucleate on such surfaces. Copper can be adequately deposited on other surfaces, however, having a reduction half-reaction potential similar to that of the half-reaction potential for the reduction of titanium dioxide (i.e., about −0.86 Volts). Yet, copper will only adequately deposit on such surfaces if the activation energy for reduction of oxides of that material is not too high as compared to the activation energy for titanium dioxide reduction. For example, the activation energy for reduction of silicon dioxide is very high. Although the reduction half-reaction, $SiO_2 + 4H^+ + 4e^- \rightarrow Si + 2H_2O$, has a potential of −0.84 Volts, copper does not deposit well on silicon in accordance with this half-reaction due to the relatively high activation energy for reduction of silicon dioxide. Thus, although the half-reaction potential for silicon dioxide is very similar to that for titanium dioxide, copper does not adequately adhere to silicon. It should be noted that half-reaction potentials utilized in this description are standard potentials (i.e., those at 0.1 MPa pressure and 25° C.). Furthermore, due to the desirable use of titanium-containing layers and copper in semiconductor fabrication, the invention will be described with reference to forming copper on such titanium-containing layers.

When depositing subsequent layers onto a substrate, the substrate surface is first optionally cleaned using a wide variety of suitable methods, such as by using KOH or HCl.

Such methods are well known to one skilled in the art. It is preferable to clean the substrate surface to remove contaminants from the substrate surface being processed. Contaminants are often a source of electrical failure within an IC. Therefore, it is important that contaminant levels on the substrate surface being processed are minimized during IC fabrication.

According to this invention, the catalyst layer has an oxidation half-reaction potential having a magnitude that is greater than a magnitude of the reduction half-reaction potential of titanium dioxide. In other words, an oxide of the catalyst material has a reduction half-reaction potential that is more negative than a reduction half-reaction potential of titanium dioxide. For example, the reduction and oxidation half-reaction potentials for aluminum have a magnitude of 2.32 and the reduction and oxidation half-reaction potentials of titanium dioxide have a magnitude of 0.86.

Aluminum oxidation can be the catalyzing reaction. Aluminum is one of the few metals that is formed from its corresponding oxide with a reduction half-reaction potential that is more negative than the reduction half-reaction potential for formation of titanium from titanium dioxide. The reduction half-reaction and potential for reduction to aluminum is the following: $H_2AlO_3^- + H_2O + 3e^- \rightarrow Al + 4OH^-$(−2.32 Volts). The reduction half-reaction and potential for reduction to titanium is the following: $TiO_2 + 4H^+ + 4e^- \rightarrow Ti + 2H_2O$(−0.86 Volts). The half-reaction potential for reduction to aluminum from aluminum oxide is greater than 1 Volt more negative than the half-reaction potential for reduction of titanium dioxide to form titanium. Thus, when the oxidation half-reaction potential (i.e., that potential having an opposite sign than the reduction half-reaction potential, +2.32 Volts) for aluminum is added to the reduction half-reaction potential for titanium dioxide, the overall redox reaction has a potential of greater than +1 Volt. Overall redox reactions having a positive potential proceed spontaneously. Thus, aluminum oxidizes spontaneously when placed in the electroless solution, providing electrons for reduction of titanium dioxide on the catalytic titanium-containing surface. Thus, the reaction will proceed to deposit copper on a titanium-containing surface that is substantially free of native oxides (i.e., having native oxides covering less than about 5% of the titanium-containing surface area, but preferably having native oxides covering substantially none of the titanium-containing surface area) because of the aluminum oxidation reaction.

Aluminum is patterned on a substrate as well known to one skilled in the art, such that exposed underlying layers (e.g., titanium or titanium nitride) are selected areas on which copper is to be deposited. The thickness of the aluminum layer is not critical to the practice of this invention. However, the thickness of the aluminum layer can be about 1,000 Angstroms to about 10,000 Angstroms.

Another material, such as chromium or silicon, whose corresponding oxide has a reduction half-reaction potential that is more negative than the reduction half-reaction potential for titanium dioxide, can be used instead of aluminum as the catalyst layer. When adding the corresponding oxidation half-reaction potential for the catalyst layer to the reduction half-reaction potential for titanium dioxide (i.e., −0.86 Volts), a positive overall redox potential is obtained, as required for the reaction to proceed spontaneously.

For example, one catalyzing oxidation half-reaction and potential for silicon is the following: $Si + 6OH^- \rightarrow SiO_3^{-2} + 3H_2O + 4e^-$(+1.73 Volts). Whe added to the reduction half-reaction potential for titanium dioxide, the oxidation half-reaction potential for silicon results in an overall redox potential of +0.87 Volts.

As another example, one catalyzing oxidation half-reaction and potential for chromium is the following: $Cr + 3OH^- \rightarrow Cr(OH)_3 + 3e^-$(+1.3 Volts). Another catalyzing oxidation half-reaction and potential for chromium is the following: $Cr + 4OH^- \rightarrow CrO2^- + 2H_2O + 3e^-$ (+1.2 Volts). When added to the reduction half-reaction potential for titanium dioxide, −0.86 Volts, a positive redox potential results. Thus, the reaction proceeds to remove native oxide from the titanium-containing material while the chromium catalyst layer is oxidized.

Aluminum is typically used, however, for the catalyst when depositing copper in the fabrication of semiconductor-based structures, namely due to the ease of etching aluminum to form a patterned catalyst layer. Thus, reference will be made to using aluminum oxidation as the catalyzing reaction throughout the remainder of the description.

When depositing on a titanium-containing surface, due to the effective reduction of titanium dioxide, a copper layer easily deposits on a clean titanium-containing (i.e., titanium/titanium nitride and similar materials essentially free of native oxides) surface. This results in a relatively low resistivity path through the titanium-containing and copper layers within an IC. This is particularly useful and applicable to the interconnect structure of an IC, where resistance to electrical current should be minimized.

A substrate having a patterned aluminum layer is placed in an electroless copper plating solution. Nucleation of the copper layer typically begins at interfaces between aluminum and the titanium-containing material on which copper is to be deposited (e.g., titanium or titanium nitride) and then proceeds across the substrate surface by an autocatalytic mechanism (i.e., copper is a catalyst for the deposition of more copper).

The electroless solution preferably includes at least a copper source and reducing agent and often an oxidizing agent to initiate the reducing agent. The reducing agent is needed to reduce the copper source, which is usually present in solution as copper ions, allowing it to deposit on the catalytic surface. Any suitable copper source, such as a soluble copper salt, and reducing agent are used, which will allow for copper deposition on the catalytic titanium-containing surface. For example, copper sulfates, copper oxides, copper perchlorates, and copper iodides, both cuprous and cupric, can be used for the copper source. Examples of reducing agents include formaldehyde (HCHO), 3-dimethylaminobenzoic acid (DMAB), hypophosphite ($H_2PO_2$), tetramethyl ammonium hydroxide (TMAH), ammonium hydroxide ($NH_4OH$), potassium hydroxide (KOH), glyoxylic acid ($HCOCO_2H$), and similar compounds containing hydroxyl ions. Preferably, TMAH or $NH_4OH$ is used as the reducing agent in this invention. Thus, the electroless deposition solution is preferably substantially free of alkali components (i.e., having less than about 5% alkali components by atomic weight, but preferably substantially no alkali components by weight). The temperature of the electroless solution is maintained in a range of about 20° C. to about 80° C. The temperature is preferably maintained at a constant temperature in this range using any suitable method. For example, a standard bipolar heating jacket can be used to maintain the temperature of the electroless solution.

The pH of the solution is preferably maintained in the range of about 9 to about 12. As the pH of the solution increases, the potential for the reduction half-reaction of oxides of the catalyst layer becomes even more negative, further promoting copper electroless deposition due to the more positive redox potential when used adjacent to a titanium-containing surface. If needed, the pH of the solution is adjusted by changing the amount of the reducing agent, for example, TMAH, present in the solution. Decreasing the amount of the reducing agent typically lowers the solution pH, while increasing the amount of the reducing agent typically increases the solution pH. However, if the difference between the potential for the oxidation half reaction and the potential for the reduction half reaction becomes too large, spontaneous copper precipitation can occur within the solution instead of on the desired surface. Thus, chelating agents, such as ethylenediaminetetraacetic acid (EDTA) can be added to the solution to decrease the possibility of copper precipitation at higher pHs. Other examples of ligands include malic acid (Mal), succinic acid (Suc), tartrate (Tart), citrate (Cit), nitrilotriacetic acid (NTA), triisopropanolamine (TIPA), triethanolamine (TEA), and ethylenediamine (En).

Other additives, such as inorganic and organic additives, can also be added to the solution to promote stability. Examples of such additives include metal-containing compounds (e.g., vanadium (V), molybdenum (Mo), niobium (Nb), tungsten (W), rhenium (Re), thallium (Tl), antimony (Sb), bismuth (Bi), cerium (Ce), uranium (U), mercury (Hg), silver (Ag), arsenic (As)), sulfur-containing compounds (e.g., sulfite, thiosulfates, sulfates), nitrogen-containing compounds (e.g., tetracyanoethylene, cyanides, pyridines), sulfur- and nitrogen-containing compounds (e.g., cysteines, cystines, diethyldithiocarbamates, thiosemicarbazide), oxidizing agents (e.g., $O_2$), and surfactants (e.g., complex organic phosphate esters, alkylphenoxypolyethoxy phosphates, polyethoxypolypropoxy block copolymers, anionic perfluoroalkyl sulfonates and carboxylates, non-ionic fluorinated alkyl alkoxylates, non-ionic polyalcohols, such as that sold under the trade name "Triton X," which is commercially available from Aldrich Chemical in St. Louis, Mo., and cationic fluorinated quaternary ammonium compounds).

The final thickness of the copper layer is solution-dependent. In particular, the final thickness of the copper layer is typically dependent on the pH of the electroless solution. A higher pH results in a thicker copper layer. Similarly, a lower pH results in a thinner copper layer. Typically, the final thickness of the copper layer is about 4,000 Angstroms to about 8,000 Angstroms.

Copper does not generally deposit on the aluminum layer. Rather, it tends to form next to an interface between an aluminum layer and a titanium-containing layer. If copper does deposit on another surface, such as silicon dioxide or BPSG, it will not typically adhere. Thus, the present invention allows simple metal line growth on patterned titanium-containing surfaces without additional photoresist, mask, and etch steps. Excess aluminum and any underlying layers can be removed by any suitable method, or the materials can be left in place, depending on the particular application. For example, excess aluminum or titanium-containing material can be removed using a dry etchant (e.g., an etchant typically containing a chlorine component when removing aluminum or titanium-containing materials). Due to the difficulties of dry etching copper at low temperatures (i.e., the reaction of copper with the chlorine etchant component to form a non-volatile compound at temperatures below 175° C.), copper will not be removed during a standard dry etch, such as those etches used to remove aluminum and/or titanium-containing material, unless relatively high temperatures are used. For example, aluminum can typically be etched at about 35° C., but copper is typically etched at temperatures above 175° C. Excess aluminum, however, may not be present on the substrate surface after deposition of copper from the electroless solution. During the redox reaction of the present invention, aluminum reacts to form aluminum oxide (e.g., alumina), which readily dissolves in the electroless copper deposition solution. Thus, separate aluminum or aluminum oxide removal steps may not be necessary depending on the reaction time and the electroless copper deposition solution used.

The copper layer formed using the method of the invention is typically more conductive than aluminum metal lines. By using a relatively high pH electroless deposition solution, the speed of copper deposition is increased, allowing for a relatively large grain structure in the copper layer. Furthermore, when anneal steps are necessary after formation of the copper layer to optimize the grain size of the copper layer (to make fewer, larger grains th-an the grains in the as-deposited copper layer in order to make the copper layer more conductive), the anneal can be performed at shorter times and/or lower temperatures due to the fine grain structure of the deposited copper layer. This advantageously conserves thermal budget of the IC fabrication process. A thermal budget for fabricating an IC is the maximum combination of thermal steps and length of time during such thermal steps that an IC can withstand before its electrical characteristics are potentially degraded. For example, as ICs are scaled down in size, junction depths are becoming shallower. One of the problems associated with long thermal steps is dopant migration into undesired regions. Such shallow junctions are more easily degraded by long thermal steps due to dopant migration.

Furthermore, use of aluminum potentially allows for alkali-free deposition on titanium-containing surfaces, as well as other substrates having a reduction half-reaction potential similar to that of titanium dioxide. This is due to the aluminum oxidation catalyzing reaction, which speeds up the electroless copper deposition rate. Thus, the pH of the solution need not be adjusted using alkali-containing components in order to further speed up the deposition rate.

The methods of the present invention can be used in a variety of locations in semiconductor fabrication processes to form a variety of structures. For example, they can be used in dual damascene processes, as disclosed in U.S. Pat. No. 4,962,058 (Cronin et al.), and others. They can be used to form plugs and interconnect structures. Examples of electroless deposition solutions utilized for this invention follow.

EXAMPLE 1

Figure 1B:
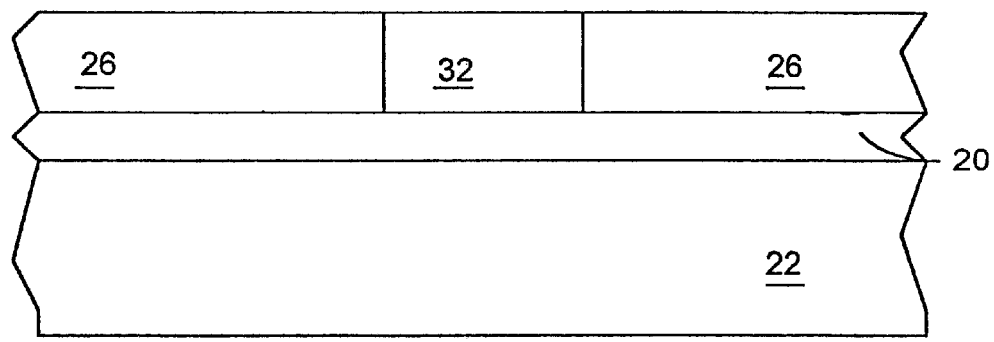
Figure 1C:
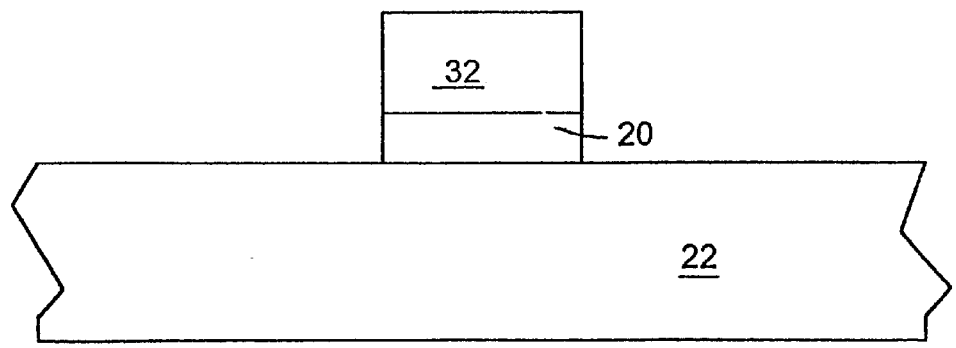

Intermediate and resulting structures of this example are illustrated in FIGS. 1A to 1C. A titanium layer 20 is patterned (e.g., sputtered, photolithographically masked, and etched) on a silicon substrate 22 to a thickness 24 of about 200 Angstroms. An aluminum layer 26 having a thickness 27 of about 10,000 Angstroms is then patterned (e.g., sputtered, photolithographically masked, and etched) over the titanium layer 20, leaving an exposed titanium/aluminum interface 28 adjacent to an exposed titanium region 30, as illustrated in FIG. 1A. The aluminum layer 26 is in contact with the titanium layer 20 at the interface 28. The structure is then plated in a 50 mL aqueous solution containing:

| | |
|---|---|
| CuSO$_4$ | 0.624 g |
| EDTA | 0.821 g |
| TMAH | 19.2 mL |
| Triton X | 1 mL |
| HCHO | 0.375 mL |
| Deionized Water | Remainder (total solution volume = 50 mL) | to produce a copper layer 32 over the exposed titanium region 30, as illustrated in FIG. 1B. Copper 32 nucleates at the aluminum/titanium interface 28 and spreads across the exposed titanium region 30. If it is desired to stop the deposition of copper 32 prior to depletion of the aluminum 26 on the surface, the structure can be placed in another solution, such as water or an acidic solution. The structure is then subjected to rapid thermal processing (RTP) at about 500° C. to about 700° C. to optimize the grain structure of the copper layer 32. The lower the RTP temperature, the longer the anneal duration. For example, for RTP at about 500° C., about 45 seconds is the anneal duration. The higher the RTP temperature, the shorter the anneal duration. For example, for RTP at about 700° C., about 15 seconds is the anneal duration. Any remaining aluminum layer 26 and titanium layer 20 underlying the aluminum layer 26 are then removed using appropriate etchants, such as dry etchants, to produce the structure illustrated in FIG. 1C. In this example, titanium 20 has been described, but titanium nitride can be substituted for titanium 20 in other embodiments. Other variations will be apparent to one of ordinary skill in the art.

EXAMPLE 2

Figure 2A:
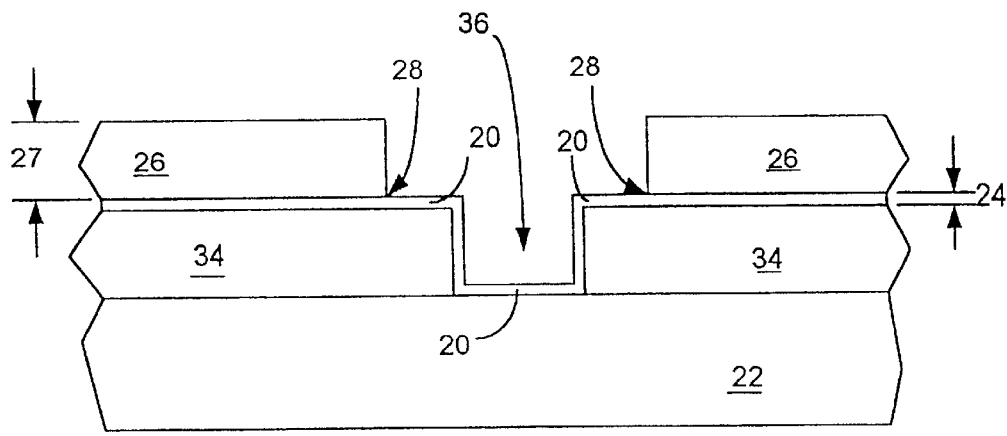
FIGS. 2A, 2B, and 2C are cross-sectional representations of copper deposited using a dual damascene process in accordance with the present invention, and intermediate structures thereof.
Figure 2B:
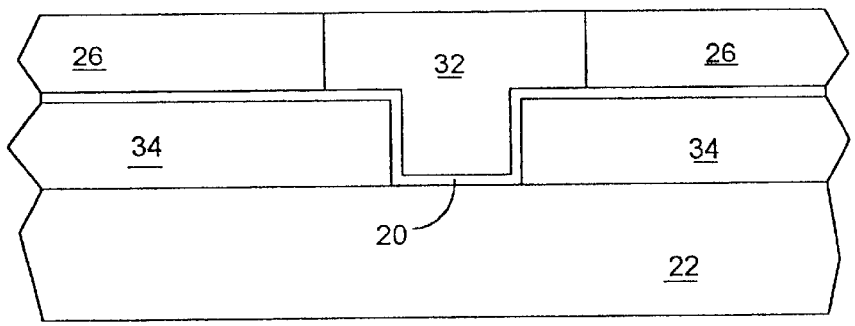
Figure 2C:
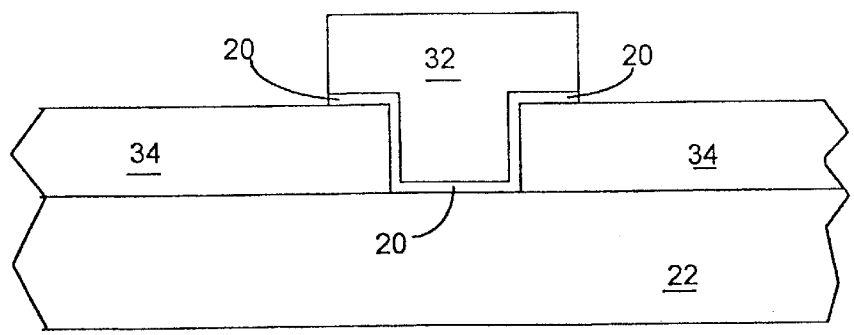

Intermediate and resulting structures of this example are illustrated in FIGS. 2A to 2C. An insulating layer 34, such as silicon dioxide, is formed (e.g., by thermally oxidizing silicon) over a silicon substrate 22. A via 36 is then defined (e.g., by etching the silicon dioxide to leave an opening through the silicon dioxide having dimensions of the via) in the insulating layer 34 over an active area in the substrate 22. A titanium layer 20 is then formed (e.g., sputtered, photolithographically masked, and etched) in the via 36 and an adjacent area to a thickness 24 of about 200 Angstroms.

An aluminum layer 26 is deposited such that an aluminum/titanium interface 28 resides on each continuous titanium layer 20 on which copper 32 deposition is desired. For example, an aluminum layer 26 having a thickness 27 of about 10,000 Angstroms is patterned (e.g., sputtered, photolithographically masked, and etched) over the titanium layer 20, leaving an exposed titanium/aluminum interface 28 facing the via 36, as illustrated in FIG. 1A. The aluminum layer 26 is patterned as in a dual damascene process, such that copper 32 can at least partially fill the via 36 and the area between the patterned aluminum layer 26, forming a copper plug and copper line thereon. Thus, the patterned aluminum layer 26 is formed such that an exposed titanium-containing layer 20 surrounds the via 36. In a dual damascene process, the exposed insulating layer region (with or without a titanium-containing layer thereon) adjacent to the via 36 has a larger surface area than the area of the via 36 in a two-dimensional plane of the substrate 22. To form the copper plug and copper line thereon, the structure illustrated in FIG. 2A is plated in a 50 mL aqueous solution containing:

| | |
|---|---|
| CuSO$_4$ | 0.624 g |
| EDTA | 0.821 g |
| TMAH | 19.2 mL |
| Triton X | 1 mL |
| HCHO | 0.375 mL |
| Deionized Water | Remainder (total solution volume = 50 mL) | to produce the structure illustrated in FIG. 2B. Copper 32 nucleates at the aluminum/titanium interface 28 and spreads into the via 36. If it is desired to stop the deposition of copper 32 prior to depletion of the aluminum 26 on the surface, the structure can be placed in another solution, such as water or an acidic solution. The structure is then subjected to rapid thermal processing (RTP) at about 500° C. to about 700° C. to optimize the grain structure of the copper layer 32. The lower the RTP temperature, the longer the anneal duration. For example, for RTP at about 500° C., about 45 seconds is the anneal duration. The higher the RTP temperature, the shorter the anneal duration. For example, for RTP at about 700° C., about 15 seconds is the anneal duration. Any remaining aluminum layer 26 and titanium layer 20 underlying the aluminum layer 26 are then removed using appropriate etchants, such as dry etchants, to produce the structure illustrated in FIG. 2C. Variations of this example include forming (e.g., sputtering) a tungsten plug in the via 36 prior to forming the patterned aluminum layer 26 over the structure. Copper 32 then deposits only over the tungsten plug, forming a conductive line, such as a digit line. It is also to be noted that sidewalls of the via 36 are coated with the titanium layer 20 in FIGS. 2A to 2C, but if collimated sputtering is used to deposit the titanium 20, the sidewalls of the via 36 may not be coated with the titanium layer 20. In that embodiment, in order for copper to deposit on the titanium layer 20 formed at the bottom of the via, discontinuous with the titanium layer 20 adjacent the via 36, another aluminum layer 26 would need to contact the titanium layer 20 at the bottom of the via 36. This second aluminum layer 26 is needed to provide a titanium/aluminum interface 28 on the titanium layer 20 at the bottom of the via 36. According to other variations of this Example, titanium nitride can be substituted for the titanium layer 20 in the above example. Other variations will be apparent to one of ordinary skill in the art.

EXAMPLE 3

Figure 3A:
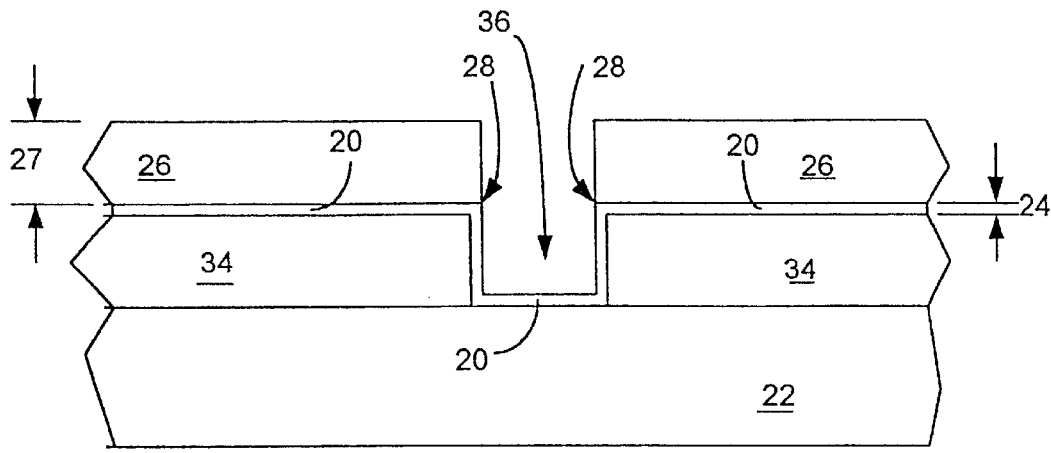
FIGS. 3A, 3B, and 3C are cross-sectional representations of copper deposited using a single damascene process in accordance with the present invention, and intermediate structures thereof.
Figure 3B:
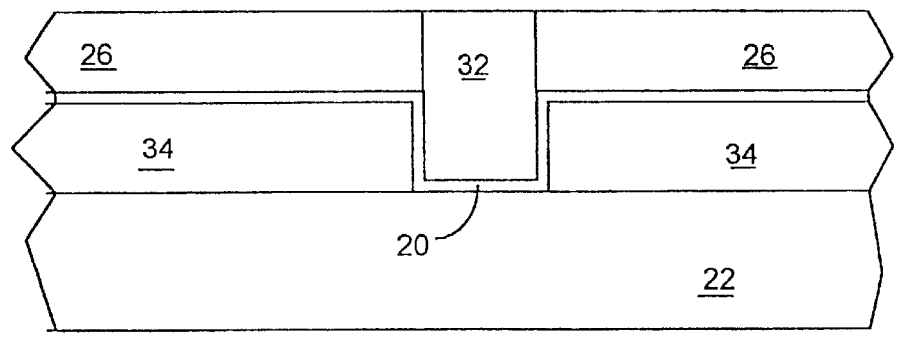
Figure 3C:
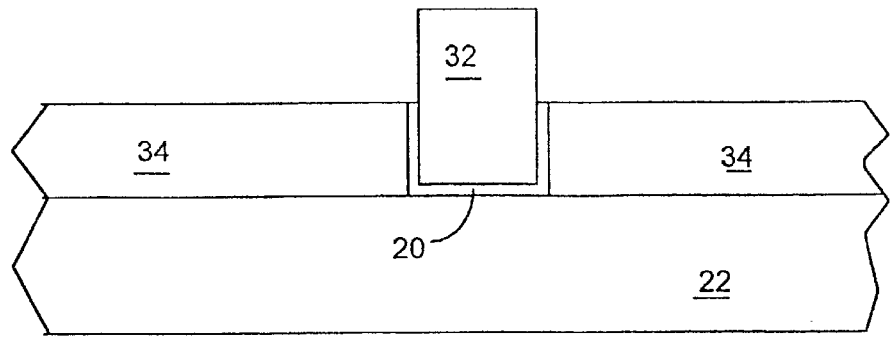

Intermediate and resulting structures of this example are illustrated in FIGS. 3A to 3C. An insulating layer 34, such as silicon dioxide, is formed (e.g., by thermally oxidizing silicon) over a silicon substrate 22. A via 36 is then defined (e.g., by etching the silicon dioxide to leave an opening through the silicon dioxide having dimensions of the via) in the insulating layer 34 over an active area in the substrate 22 as well known to one skilled in the art. A titanium layer 20 is then formed (e.g., sputtered, photolithographically masked, and etched) in the via and on the sidewalls of the via as well as over insulating layer 34 to a thickness 24 of about 200 Angstroms. An aluminum layer 26 having a thickness 27 of about 10,000 Angstroms is then patterned (e.g., sputtered, photolithographically masked, and etched) over the titanium layer 20, leaving an exposed titanium/aluminum interface 28 facing the via 36, at the top of the sidewall of the via 36, as illustrated in FIG. 1A. The aluminum layer 26 is patterned as in a single damascene process, such that copper 32 can at least partially fill the via 36, forming a copper plug therein. To form the copper plug, the structure illustrated in FIG. 3A is plated in a 50 mL aqueous solution containing:

| | |
|---|---|
| CuSO$_4$ | 0.624 g |
| EDTA | 0.821 g |
| TMAH | 19.2 mL |
| Triton X | 1 mL |
| HCHO | 0.375 mL |
| Deionized Water | Remainder (total solution volume = 50 mL) | to produce the structure illustrated in FIG. 3B. Copper 32 nucleates at the aluminum/titanium interface 28 and spreads into the via 36. If it is desired to stop the deposition of copper 32 prior to depletion of the aluminum 26 on the surface, the structure can be placed in another solution, such as water or an acidic solution. The structure is then subjected to rapid thermal processing (RTP) at about 500° C. to about 700° C. to optimize the grain structure of the copper layer 32. The lower the RTP temperature, the longer the anneal duration. For example, for RTP at about 500° C., about 45 seconds is the anneal duration. The higher the RTP temperature, the shorter the anneal duration. For example, for RTP at about 700° C., about 15 seconds is the anneal duration. Any remaining aluminum layer 26 and titanium layer 20 underlying the aluminum layer 26 are then removed using appropriate etchants, such as dry etchants, to produce the structure illustrated in FIG. 3C. Variations of this example include substitution of titanium nitride for the titanium layer 20 in the above example. Other variations will be apparent to one of ordinary skill in the art.

EXAMPLE 4

Figure 4A:
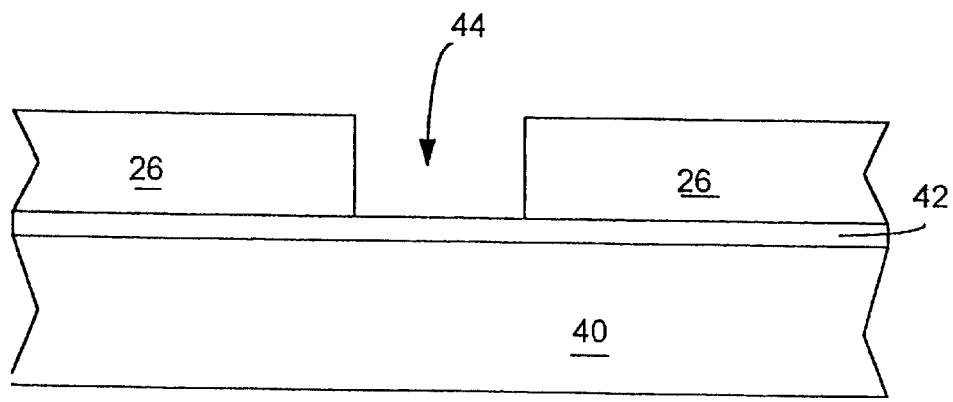
FIGS. 4A, 4B, and 4C are cross-sectional representations of copper deposited on a printed circuit board in accordance with the present invention, and intermediate structures thereof.
Figure 4B:
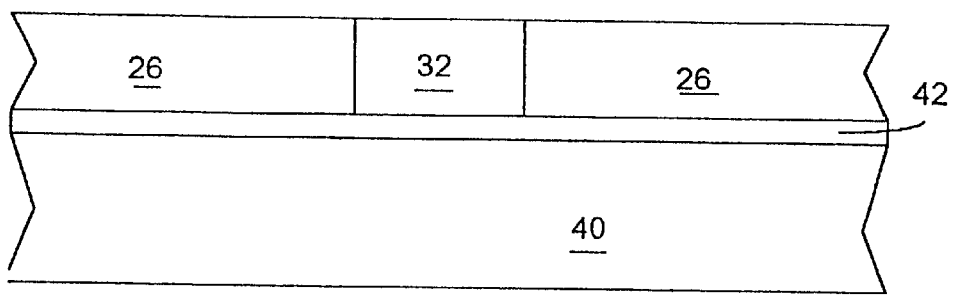
Figure 4C:
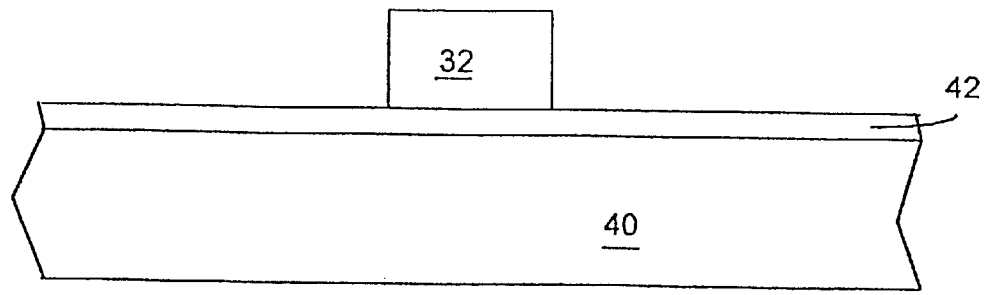

Intermediate and resulting structures of this example are illustrated in FIGS. 4A to 4C. A printed circuit board (PCB) 40 is sputtered with a thin layer (i.e., a layer having a thickness of about 50 Angstroms to about 1,000 Angstroms) of titanium 42, as illustrated in FIG. 4A and as well known to one in the art of PCB manufacture. The titanium 42 is then patterned using conventional photolithography and etching to define an area over which copper is desired. The PCB is then patterned with an aluminum layer 26 (e.g., sputtering aluminum 26 onto the PCB, photolithographically masking the aluminum 26, and etching the aluminum 26) to produce exposed titanium 44 between the patterned aluminum 26. Copper 32 is then deposited on the exposed titanium 44, as illustrated in FIG. 4B, by plating the structure illustrated in FIG. 4A in a 50 mL aqueous solution containing:

| | |
|---|---|
| CuSO$_4$ | 0.624 g |
| EDTA | 0.821 g |
| TMAH | 19.2 mL |
| TritonX | 1 mL |
| HCHO | 0.375 mL |
| Deionized Water | Remainder (total solution volume = 50 mL) |

Any remaining aluminum-layer 26 and titanium layer 42 underlying the aluminum layer 26 are then removed using appropriate etchants, such as dry etchants, to produce the PCB 40 with copper lines 32 thereon, a portion of which is illustrated in FIG. 4C.

All patents, patent applications, and publications disclosed herein are incorporated by reference in their entirety, as if individually incorporated. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A method for forming a plug in an integrated circuit interconnect structure, the method comprising:

providing a substrate;

forming an insulating layer on the substrate;

defining a via in the insulating layer over an active area in the substrate;

forming a titanium-containing layer in the via and over the insulating layer;

forming a patterned catalyst layer over the titanium-containing layer; and depositing copper onto exposed regions of the titanium-containing layer using electroless deposition.

2. The method of claim 1 wherein the method further comprises removing the patterned catalyst layer.

3. The method of claim 1 wherein the catalyst is selected from aluminum, silicon, chromium, and combinations thereof.

4. The method of claim 1 wherein the method further comprises removing the titanium-containing layer.

5. A method for forming an interconnect structure in an integrated circuit, the method comprising:

providing a substrate;

forming an insulating layer on the substrate;

defining a via in the insulating layer over an active area in the substrate;

forming a titanium-containing layer in the via and over the insulating layer;

forming a patterned catalyst layer over the titanium-containing layer, such that an exposed region of the insulating layer surrounds the via; and depositing copper using electroless deposition onto exposed regions of the titanium-containing layer.

6. The method of claim 5 wherein the method further comprises removing the patterned catalyst layer.

7. The method of claim 5 wherein forming the patterned catalyst layer comprises forming a patterned catalyst layer selected from aluminum, silicon, chromium, and combinations thereof.

8. The method of claim 5 wherein the method further comprises removing the titanium-containing layer.

* * * * *